United States Patent
Wang et al.

(10) Patent No.: US 6,400,030 B1
(45) Date of Patent: Jun. 4, 2002

(54) SELF-ALIGNING VIAS FOR SEMICONDUCTORS

(75) Inventors: Fei Wang, San Jose; Robin Cheung, Cupertino; Mark S. Chang, Los Altos; Richard J. Huang, Cupertino; Angela T. Hui, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/583,817

(22) Filed: May 30, 2000

Related U.S. Application Data

(63) Continuation of application No. 09/097,126, filed on Jun. 12, 1998.

(51) Int. Cl.$^7$ .................................... H01L 23/48
(52) U.S. Cl. ........................ 257/774; 438/633
(58) Field of Search .................. 257/412, 413, 257/751, 758, 773, 774, 776, 767; 438/180, 229, 299, 320, 339, 364

(56) References Cited

U.S. PATENT DOCUMENTS

| | | | | |
|---|---|---|---|---|
| 5,880,018 A | * | 3/1999 | Boeck et al. | 438/619 |
| 5,981,377 A | * | 11/1999 | Koyama | 438/633 |
| 6,124,201 A | * | 9/2000 | Wang et al. | 438/634 |
| 6,144,099 A | * | 11/2000 | Lopatin et al. | 257/758 |
| 6,153,935 A | * | 11/2000 | Edelstein et al. | 257/773 |
| 6,215,189 B1 | * | 4/2001 | Toyoda et al. | 257/773 |

* cited by examiner

*Primary Examiner*—David Nelms
*Assistant Examiner*—Bau T Le
(74) *Attorney, Agent, or Firm*—Mikio Ishimaru

(57) ABSTRACT

An integrated circuit having semiconductor devices is connected by a first conductive channel damascened into a first oxide layer above the devices. A stop nitride layer, a via oxide layer, a via nitride layer, and a via resist are sequentially deposited on the first channel and the first oxide layer. The via resist is photolithographically developed with rectangular cross-section vias greater than the width of the channels and the via nitride layer is etched to the rectangular cross-section. A second channel oxide layer and a second channel resist are sequentially deposited on the via nitride layer and the exposed via oxide layer. The second channel resist is photolithographically developed with the second channels and an anisotropic oxide etch etches the second channels and rectangular box vias down to the stop nitride layer. The stop nitride layer is nitride etched in the rectangular via configuration and conductive material is damascened into the second channels and the via to be chemical-mechanical polished to form the interconnections between two levels of channels.

10 Claims, 7 Drawing Sheets

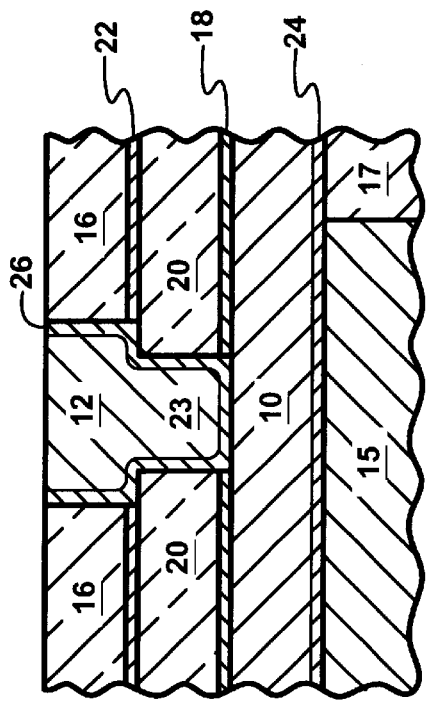
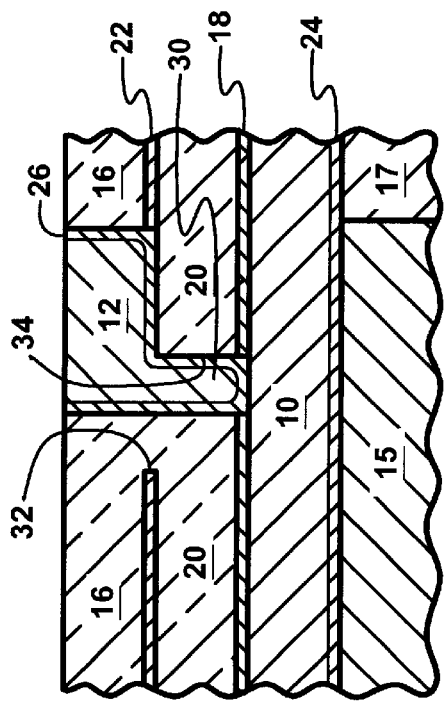
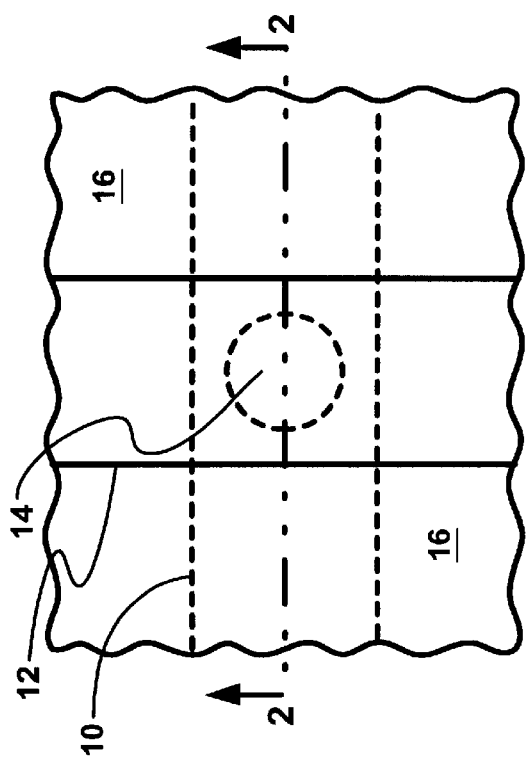
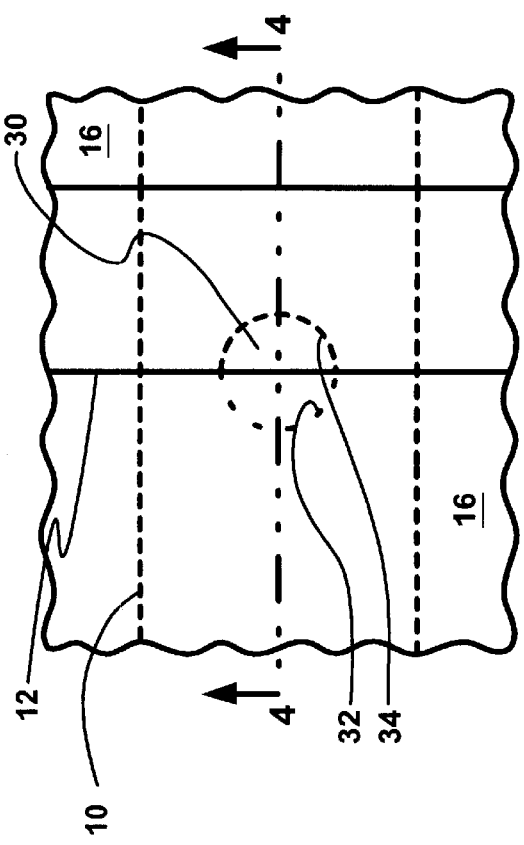

SELF-ALIGNING VIAS FOR SEMICONDUCTORS

CROSS REFERENCE TO RELATED APPLICATION(S)

This is a continuation of application Ser. No. 09/097,126 filed on Jun. 12, 1998.

TECHNICAL FIELD

The present invention relates generally to semiconductors and more specifically to semiconductor vias.

BACKGROUND ART

In the process of manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel oxide layer over the semiconductor devices. A first damascene step photoresist is then placed over the oxide layer and is photolithographically processed to form the pattern of the first channels. An anisotropic oxide etch is then used to etch out the channel oxide layer to form the first channels. The damascene step photoresist is stripped and a barrier material is deposited to coat the walls of the first channels to prevent electromigration of subsequently deposited channel material into the oxide layer and the semiconductor. The channel material is then deposited and subjected to a chemical-mechanical polishing process which removes the channel material above the first channel oxide layer and damascenes the channel in the first channels.

The via formation step of the dual damascene process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

It should be noted here that round via areas, which result in cylindrical vias, have been the standard since the inception of the semiconductor industry. This is because they are easy to form, have previously had the greatest tolerance to misalignment of the channels they connect, and are easy to completely fill with conductive material.

A nitride etch is then used to etch out the round via areas in the via nitride. The via step photoresist is then removed, or stripped. A second channel oxide layer is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer into the pattern of the second channels and, during the same etching process to etch the via areas down to the thin stop nitride layer above the first channels. The damascene photoresist is then removed, and a nitride etch process removes the nitride above the first channels in the via areas. A barrier material is then deposited to coat the vias and the second channels. This is followed by a deposition of the second in the second channels and the vias. A second chemical mechanical polishing process leaves the two vertically separated, horizontally perpendicular channels connected by cylindrical vias.

As the width of the channels has decreased in size due to the size reduction in the semiconductor devices which have given integrated circuits their increasing capabilities, a major drawback with having a cylindrical via has started to appear. It is now apparent that such vias are highly sensitive to misalignment of the channels. If the second channel is not placed in exactly the right position, or aligned, over the round via area, the second damascene etch step will not remove the entire cross-sectional area of the round via area. Thus, misalignment causes the cylindrical volume of the vias to be truncated. This means that there is less current carrying capacity and more resistance in the vias between the first and second channels. And in some cases, the cross-sectional area is so small that the vias can not be filled and voids form preventing any contact between the channels at all. This in turn means a higher defect density and a lower yield of integrated circuits.

Even further, as the size of semiconductors are reduced in order to create more capable integrated circuits, this problem gets much worse because the sizes of the channels decrease as do the sizes of the vias.

Problems with alignment are introduced from such factors as aberrations in the lenses used in the photolithographic processes, inaccuracies in the stepping equipment for reproducing images on the semiconductor wafers, photomask alignment problems, etc.

It has long been known that accurate placement of channels and vias were important so methods for reducing the need for this accuracy have been long sought but its importance for smaller and smaller devices have been under appreciated. Previous solutions to these problems have involved improving the accuracy of alignment.

A solution, which would reduce the need for accurate placement has long been considered, but has eluded those skilled in the art. This is especially true since it has long been known that the problems would become more severe with the reductions in integrated circuit size to sub-micron and deep sub-micron levels.

SUMMARY OF THE INVENTION

The present invention provides self-aligning channels by making the via between the channels in the shape of an elongated cross-section volume such that the via cross-section remains the same when there is a tolerance variation in the positions of the channels relative to each other.

The present invention provides a method of manufacturing semiconductors having a high degree of tolerance to misalignment of the channels.

The present invention further provides a method of manufacturing semiconductors having multiple layers of channels with interconnecting vias, which have a high degree of tolerance to misalignment of the channels.

The present invention still further provides an integrated circuit having elongated cross-section vias, which provide constant size vias despite tolerance variations in the positioning of the channels.

The present invention also provides an integrated circuit which has vias that properly connect the semiconductor devices without failures due to voids.

The above and additional advantages of the present invention will become apparent to those skilled in the art from a reading of the following detailed description when taken in conjunction with the accompanying drawings.

BRIEF DESCRIPTION OF THE DRAWINGS

FIG. 1 PRIOR ART is a plan view of aligned channels with a prior art via;

FIG. 2 PRIOR ART is a cross-section of FIG. 1 along line 2—2;

FIG. 3 PRIOR ART is a plan view of misaligned channels with a prior art via;

FIG. 4 PRIOR ART is a cross-section of FIG. 3 along line 4—4;

BEST MODE FOR CARRYING OUT THE INVENTION

Figure 6:
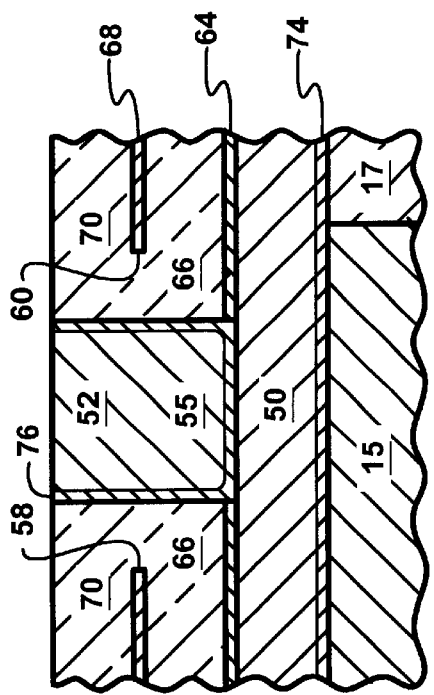
FIG. 6 is a cross-section of FIG. 5 along line 6—6.

Referring now to FIG. 1 PRIOR ART, therein is shown a plan view of a prior art pair of aligned semiconductor channels of a conductive material such as aluminum, copper, tungsten or polysilicon. A first channel 10 is shown disposed below a second channel 12 which extends substantially perpendicular to the first channel 10 in the plan view. A round via 14 connects the first and second channels 10 and 12, which is a part of the second channel 12. The second channel 12 is disposed in a second channel oxide layer 16.

Referring now to FIG. 2 PRIOR ART, therein is shown a cross-section of FIG. 1 along 2—2. The first channel 10 is disposed over a polysilicon gate 15 and a dielectric 17 of a semiconductor device on an integrated circuit chip (not shown). The first and second channels 10 and 12 are in horizontal planes separated vertically by a stop nitride layer 18, a via oxide layer 20, and a thin via nitride layer 22. The cross-sectional area of the round via 14 of FIG. 1 defines a cylindrical via 23.

Also shown disposed around the first channel 10 is barrier material 24, and around the second channel 12 and the cylindrical via 23 is barrier material 26. Barrier materials, where necessary, are used to prevent electromigration of the channel materials into the adjacent areas of the semiconductor. For example, a compound of trace percentages of copper would be used for aluminum channels and silicon for aluminum channels. For purposes of clarity, the barrier materials 24 and 26 are not shown in FIG. 1 and FIG. 3 but are shown in the other figures.

Referring now to FIG. 3 PRIOR ART, therein is shown a plan view of a prior art cylindrical via with misaligned channels. The second channel 12 is out of alignment by being shifting right in the plan view as contrasted to the proper alignment as shown in FIG. 1 PRIOR ART. The reduced size via 30 is shown still centered with respect to the first channel 10, although this position could also be shifted vertically in the plan view.

Referring to FIG. 4 PRIOR ART, therein is shown the cross-section of FIG. 3 along line 4—4. The opening 32 and an opening 34 define the plan view of the reduced size via 30. A comparison of the cylindrical via 23 in FIG. 2 PRIOR ART and the truncated semi-cylindrical via 30 in FIG. 4 PRIOR ART shows the reduction in volume of the via between the first and second channels 10 and 12 when misalignment occurs. If the volume is sufficiently reduced, the via 30 will have voids or be completely empty of conductive material.

Figure 5:
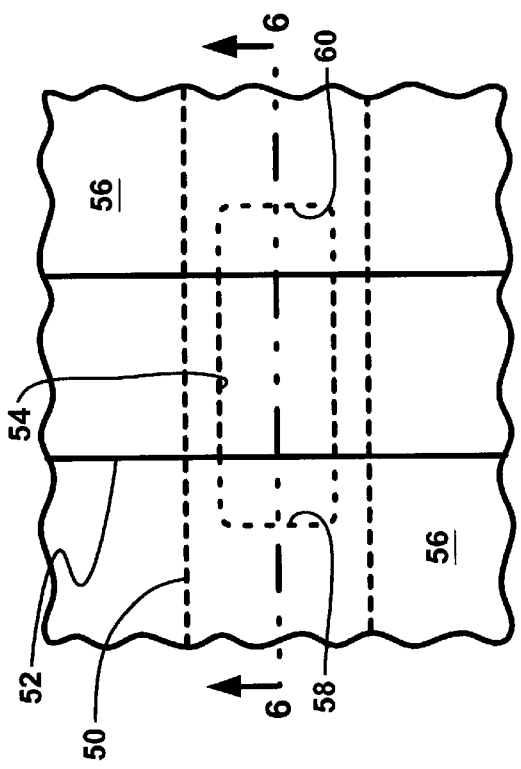
FIG. 5 is a plan view of aligned channels with a self-aligning via.

Referring now to FIG. 5, therein is shown a plan view of aligned channels with a self-aligning via of the present invention. A first channel 50 is shown disposed below a second channel 52 which extends substantially perpendicular to the first channel 50 in the plan view. The first and second channels 50 and 52 are connected by a rectangular via opening 54, which is a part of the second channel 52. The second channel 52 is disposed in a second channel oxide layer 56. Disposed on either side of the rectangular via opening 54 in FIG. 5 are openings 58 and 60 which, along with the rectangular opening, via 54, define a substantially rectangular opening in a via nitride layer, as will hereinafter be explained.

Referring now to FIG. 6, therein is shown the cross-section of FIG. 5 along the line 6—6. Therein is shown the first channel 50 having thereon a stop nitride layer 64, a via oxide layer 66, a via nitride layer 68, and a second channel oxide layer 70. The openings 58 and 60, and the rectangular via opening 54 define the previously mentioned opening in the via nitride layer 68. The rectangular via opening 54 is the cross-sectional area of a self-aligning rectangular box via 55. Also shown disposed around the first channel 50 is barrier material 74, and around the second channel 52 and the rectangular box via 55 is barrier material 76.

Figure 7:
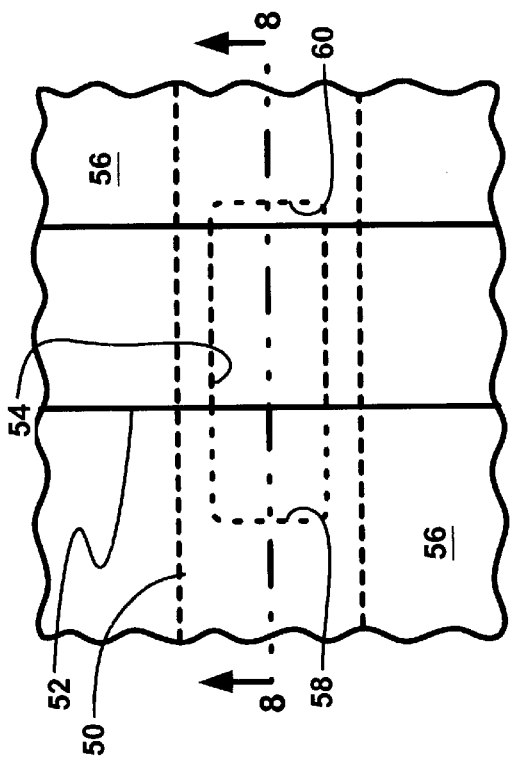
FIG. 7 is a plan view of misaligned channels with a self-aligning via.

Referring now to FIG. 7, therein is shown a plan view of misaligned first and second channels 50 and 52 with the self-aligning via 55.

Figure 8:
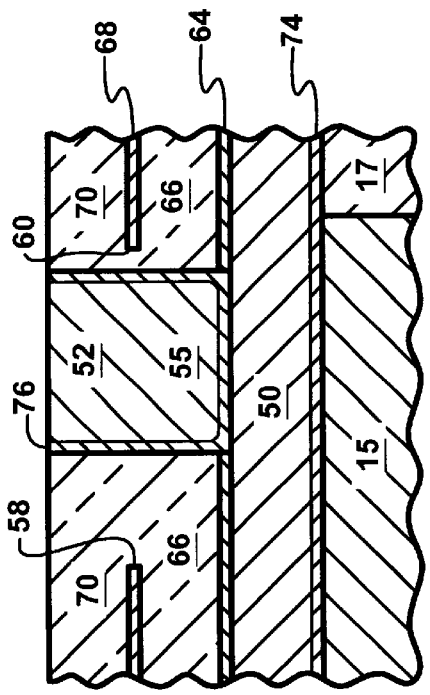
FIG. 8 is a cross-section of FIG. 7 along line 8—8.

Referring now to FIG. 8, therein is shown the first channel 50 with the second channel 52 out of alignment. By comparing FIG. 6 with FIG. 8, it can be seen that the rectangular box via 55 is the same size as in FIG. 6 even though the second channel 52 has been shifted significantly to the right in FIG. 8.

Figure 9:
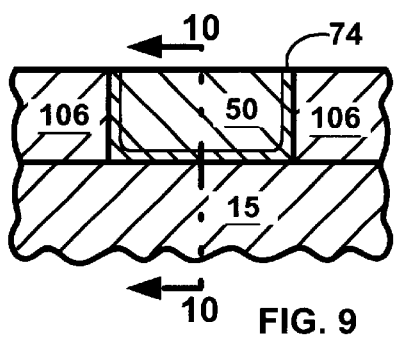
FIG. 9 is a cross-section of a semiconductor gate with a first channel.

Referring now to FIG. 9, therein is shown the first of the process steps in manufacturing integrated circuits with self-aligning vias. A semiconductor is processed to make the semiconductor devices as would be obvious to those skilled in the art. Across the top of a polysilicon gate 15 of a semiconductor device, a barrier material 74 and then a first channel 50 are deposited in electrical contact in a first channel oxide layer 106 by a first damascene process. This first damascene process is the same as the second damascene process. The first channel 50 would be extending out of the page in FIG. 9.

Figure 10:
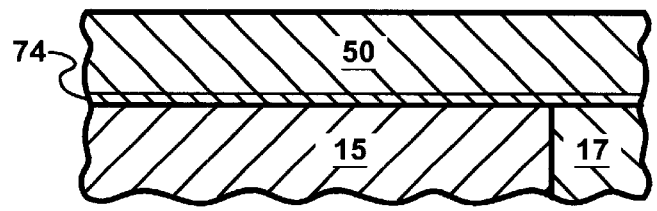
FIG. 10 is a cross-section of FIG. 9 along line 10—10.

Referring now to FIG. 10, therein is shown a cross-section of FIG. 9 along line 10—10. This shows the longitudinal length of the barrier material 74 and the first channel 50. Also shown are the polysilicon gate 15 and the dielectric 17 of the semiconductor device.

Figure 11:
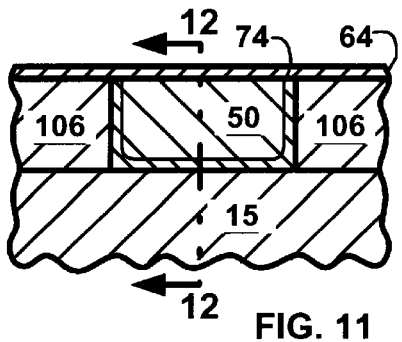
FIG. 11 is FIG. 9 with a stop nitride layer deposition.

Referring now to FIG. 11, therein is shown the structure of FIG. 9 with a stop nitride layer 64 deposited on top of the first channel oxide layer 106, the barrier material 74 and the first channel 50.

Figure 12:
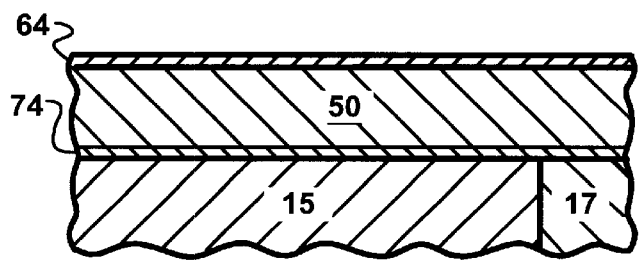
FIG. 12 is a cross-section of FIG. 11 along line 12—12.

Referring now to FIG. 12, therein is shown a cross-section of FIG. 11 along line 12—12. This shows the longitudinal length of the stop nitride layer 64.

Figure 13:
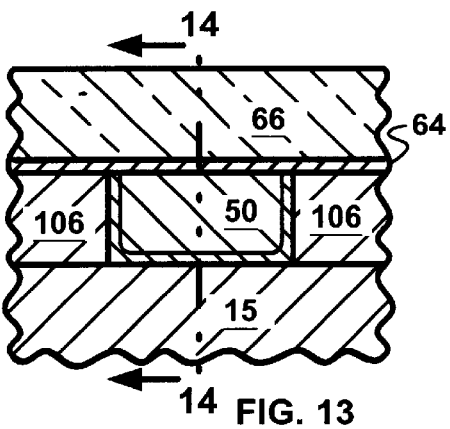
FIG. 13 is FIG. 11 with a via oxide layer deposition.

Referring now to FIG. 13, therein is shown the structure of FIG. 11 with a via oxide layer 66 disposed on top of the stop nitride layer 64.

Figure 14:
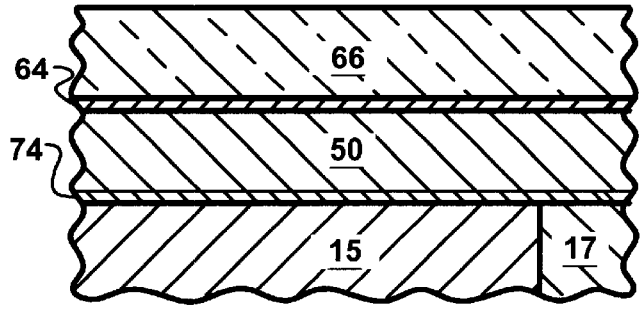
FIG. 14 is a cross-section of FIG. 13 along line 14—14.

Referring now to FIG. 14, therein is shown a cross-section of FIG. 13 along line 14—14 showing the longitudinal length of the via oxide layer 66.

Figure 15:
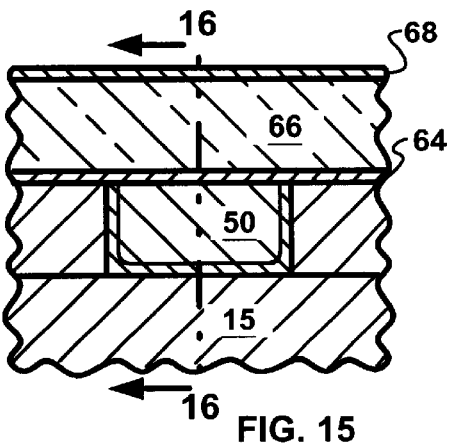
FIG. 15 is FIG. 13 with a via nitride layer deposition.

Referring now to FIG. 15, therein is shown the structure of FIG. 13 with a via nitride layer 68 deposited on the via oxide layer 66.

Figure 16:
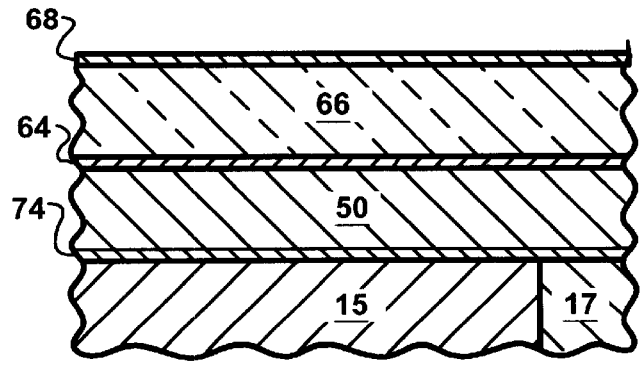
FIG. 16 is a cross-section of FIG. 15 along line 16—16.

Referring now to FIG. 16, therein is shown a cross-section of FIG. 15 along line 16—16 showing the longitudinal length of the via nitride layer 68.

Figure 17:
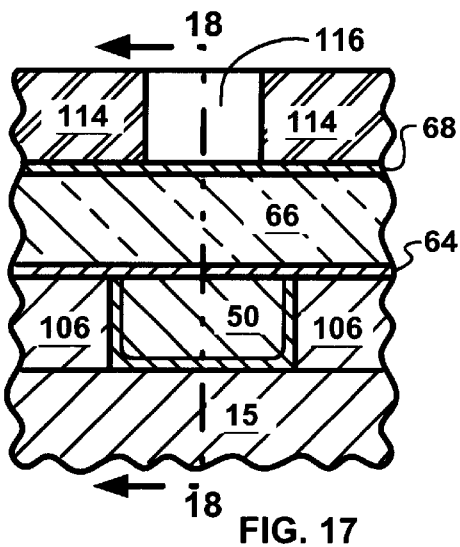
FIG. 17 is FIG. 15 after deposition of a via photoresist and photolithographic processing to develop the self-aligning via pattern.

Referring now to FIG. 17, therein is shown the structure of FIG. 15 with a via photoresist 114 in place with the width 116 of the final self-aligning via. The structure of the via photoresist 114 is formed by a conventional photolithographic process as would be evident to those skilled in the art. In this process, a layer of photoresist is first deposited on the via nitride layer 68, a via mask (not shown) is used to photolithographically expose the photoresist, and the photoresist is developed to create the via photoresist 114

Figure 18:
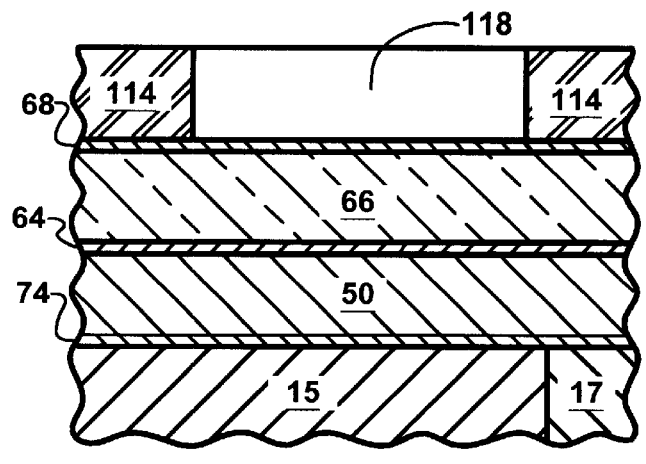
FIG. 18 is a cross-section of FIG. 17 along line 18—18.

Referring now to FIG. 18, therein is shown a cross-section of FIG. 17 along line 18—18 showing the length 118 of the final self-aligning via.

Figure 19:
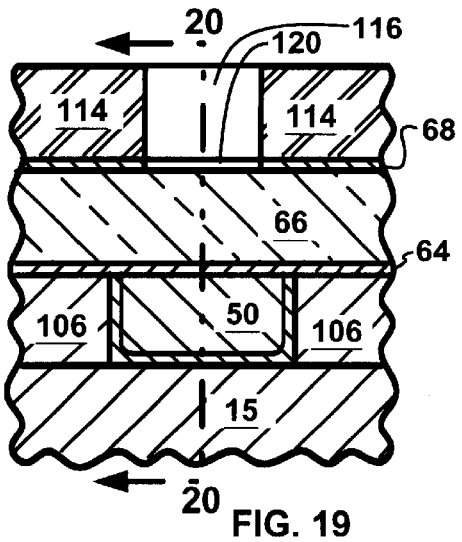
FIG. 19 is FIG. 17 after a nitride etch to remove the via nitride in the via.

Referring now to FIG. 19, therein is shown the structure of FIG. 17 after a nitride etch has been used to etch away the rectangular via opening in the via nitride layer 68 to the width 120 down to the via oxide layer 66.

Figure 20:
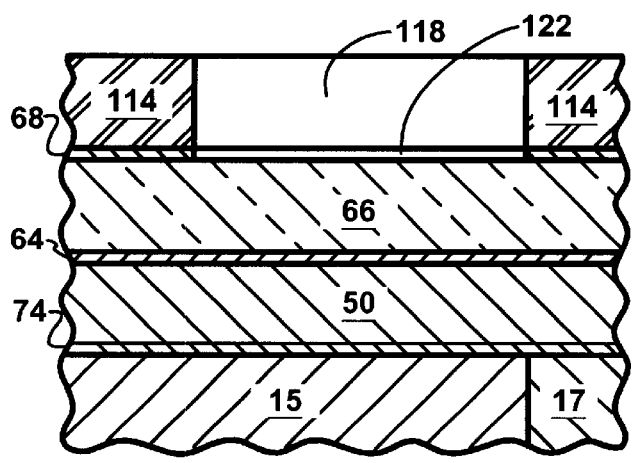
FIG. 20 is a cross-section of FIG. 19 along line 20—20.

Referring now to FIG. 20, therein is shown a cross-section of FIG. 19 along line 20—20 showing the length 122 of the rectangular via opening in the via nitride layer 68 which is etched away by the nitride etch down to the via oxide layer 66.

Figure 21:
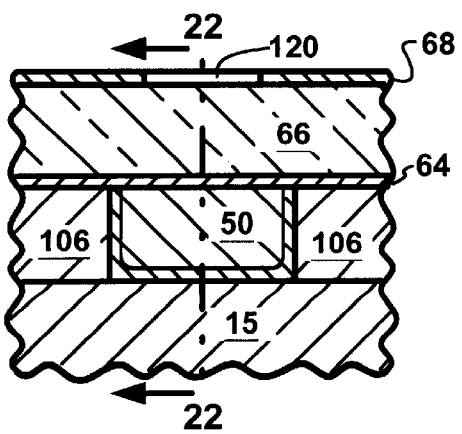
FIG. 21 is FIG. 19 after stripping of the via photoresist.

Referring now to FIG. 21, therein is shown the structure of FIG. 19 after the via photoresist 114 is stripped away to expose the via nitride layer 68 and the via oxide layer 66.

Figure 22:
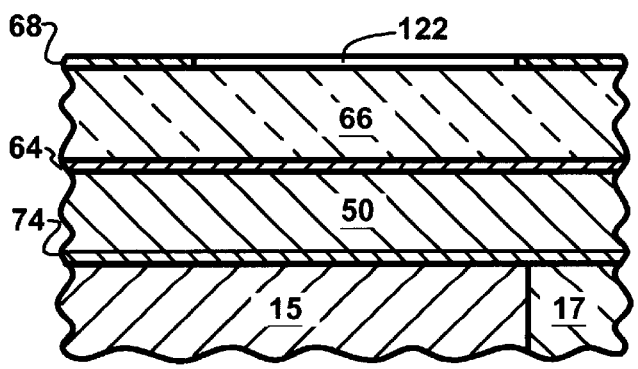
FIG. 22 is a cross-section of FIG. 21 along line 22—22.

Referring now to FIG. 22, therein is shown a cross-section of FIG. 21 along line 22—22 with the via photoresist 114 removed.

Figure 23:
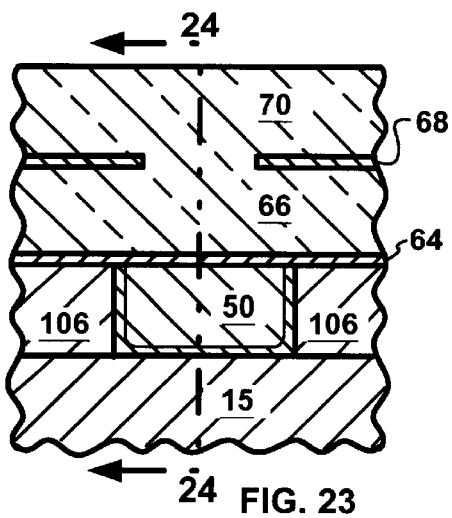
FIG. 23 is FIG. 21 with a second channel oxide layer deposition.

Referring now to FIG. 23, therein is shown the structure of FIG. 21 with a second channel oxide layer 70 disposed on top of the via nitride layer 68 and the via oxide layer 66. The channel oxide layer 70 and the via oxide layer 66 combine to form a single layer of material but are referred to separately for purposes of clarity.

Figure 24:
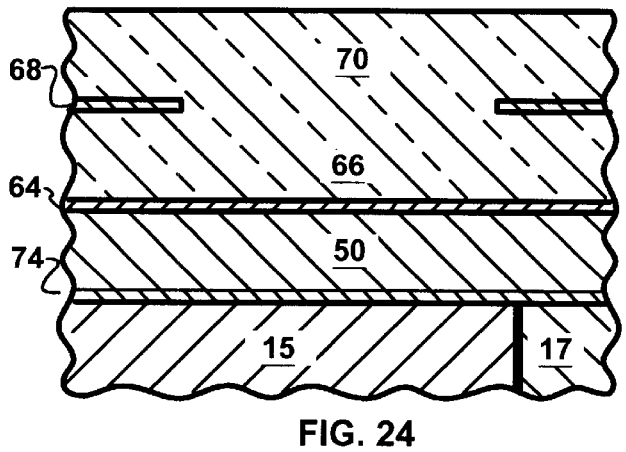
FIG. 24 is a cross-section of FIG. 23 along line 24—24.

Referring now to FIG. 24, therein is shown a cross-section of FIG. 23 along line 24—24 showing the longitudinal length of the second channel oxide layer 70.

Figure 25:
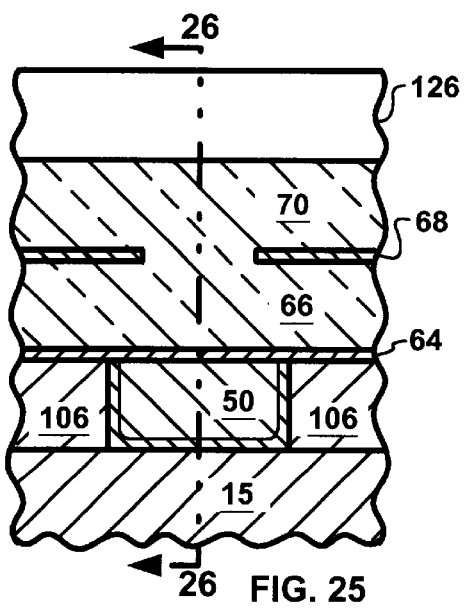
FIG. 25 is FIG. 23 after deposition of a second damascene photoresist and photolithographic processing to develop the second channel pattern.

Referring now to FIG. 25, therein is shown the structure of FIG. 23 with a second channel damascene photoresist 126 in place. A conventional photolithographic process, as would be evident to those skilled in the art, forms the structure of the damascene photoresist 126. In this process, a layer of photoresist is first deposited on the second channel oxide layer 70, a second channel mask (not shown) is used to photolithographically expose the photoresist, and the photoresist is developed to create the second channel damascene photoresist 126. For clarity, it should be explained that the second channel opening runs parallel to the page in FIG. 25.

Figure 26:
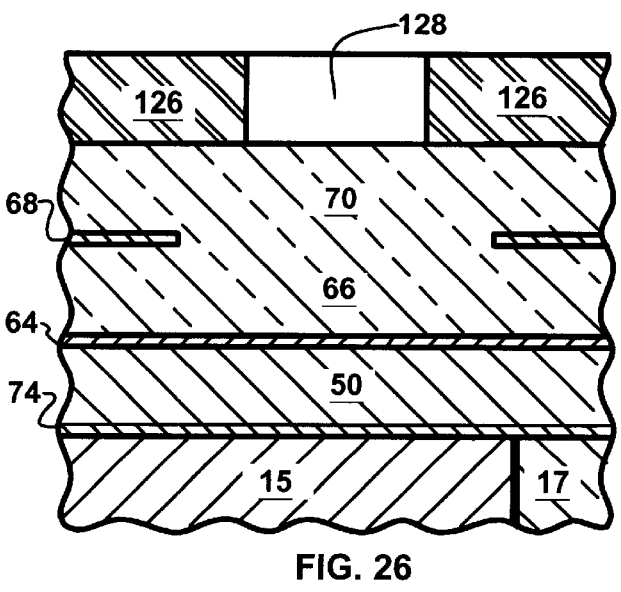
FIG. 26 is a cross-section of FIG. 25 along line 26—26.

Referring now to FIG. 26, therein is shown a cross-section of FIG. 25 along line 26—26 showing the width 128 of the final second channel in the second channel damascene photoresist 126.

Figure 27:
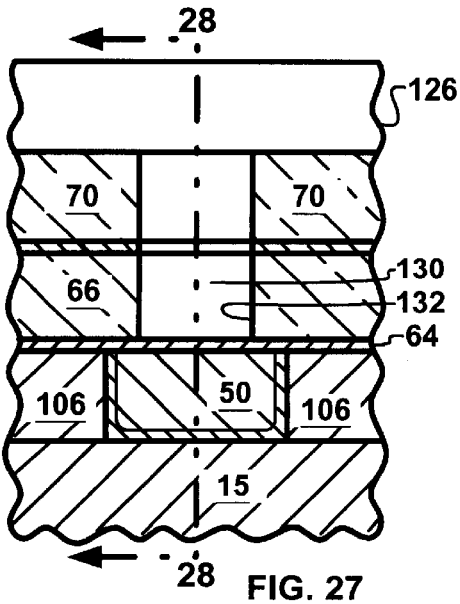
FIG. 27 is FIG. 25 after an oxide etch to remove the second channel oxide layer and the via oxide layer.

Referring now to FIG. 27, therein is shown the structure of FIG. 25 after an anisotropic oxide etch has been used to etch the second channel oxide layer 70 and the via oxide layer 66 across the width 130 of the self-aligning via opening 132. The oxide etch removes the oxide straight down to the stop nitride layer 64.

Figure 28:
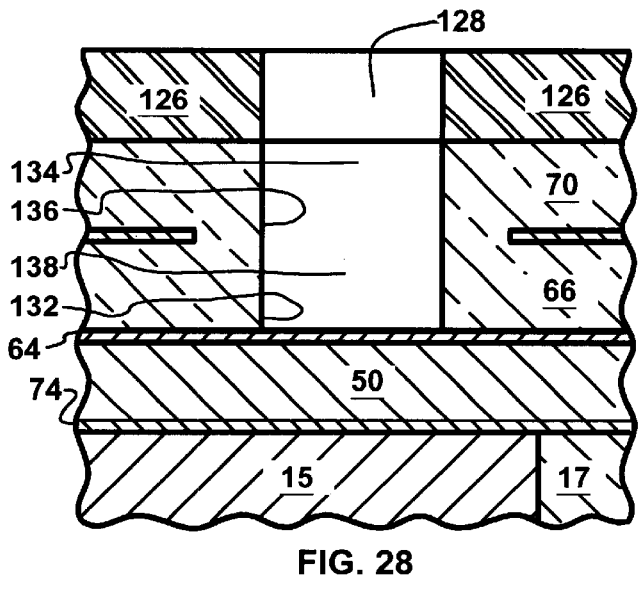
FIG. 28 is a cross-section of FIG. 27 along line 28—28.

Referring now to FIG. 28, therein is shown a cross-section of FIG. 27 along line 27—27 showing the width 134 of the second channel opening 136 and the length 138 of the self-aligning via opening 132.

Figures 29, 30:
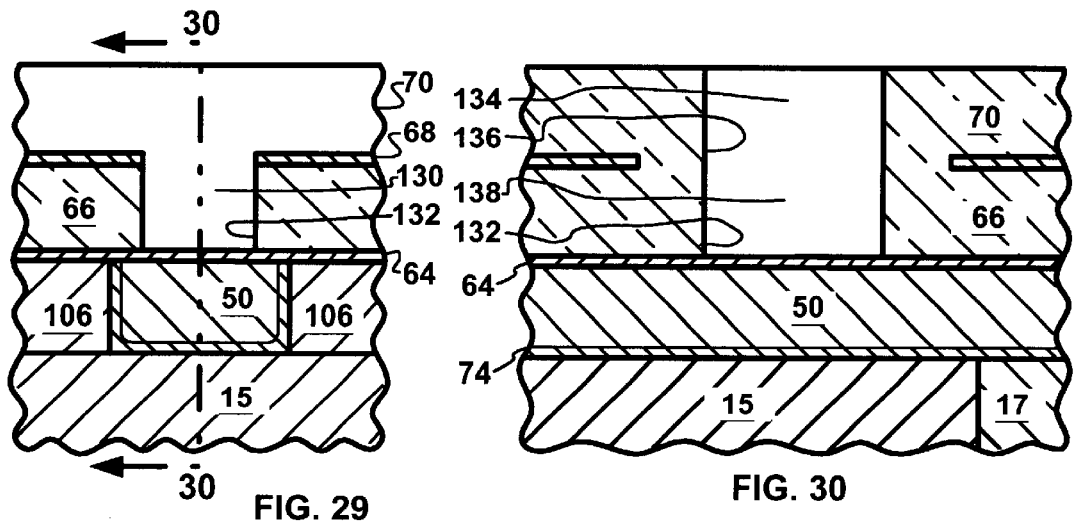
FIG. 29 is FIG. 27 after stripping the second damascene photoresist.
FIG. 30 is a cross-section of FIG. 29 along line 30—30.

Referring now to FIG. 29, therein is shown the structure of FIG. 27 after the second channel damascene photoresist 126 is stripped away to expose the second channel oxide layer 66.

Referring now to FIG. 30, therein is shown a cross-section of FIG. 29 along line 30—30 again showing the width 134 of the second channel opening 136 and the length 138 of the self-aligning via opening 132.

Figures 31, 32:
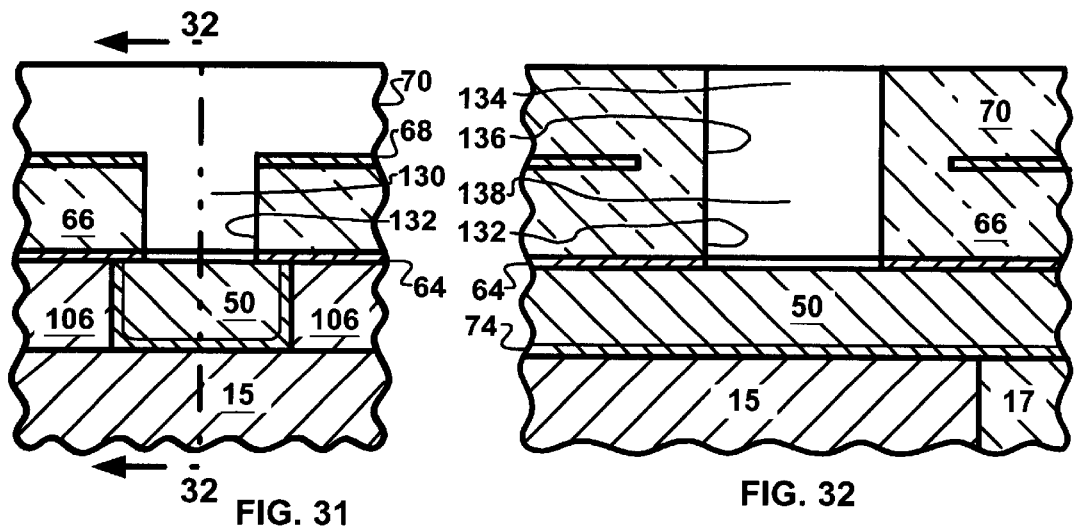
FIG. 31 is FIG. 29 after a nitride etch to remove the stop nitride layer in the self-aligned via areas.
FIG. 32 is a cross-section of FIG. 31 along line 32—32.

Referring now to FIG. 31, therein is shown the structure of FIG. 29 after a nitride etch which removed the stop nitride layer 64 over the first channel 50.

Referring now to FIG. 32, therein is shown a cross-section of FIG. 31 along line 32—32. The length of the opening in the stop nitride layer 64 is shown to be the same length as the length 138 of the self-aligning via opening 132.

Figures 33, 34:
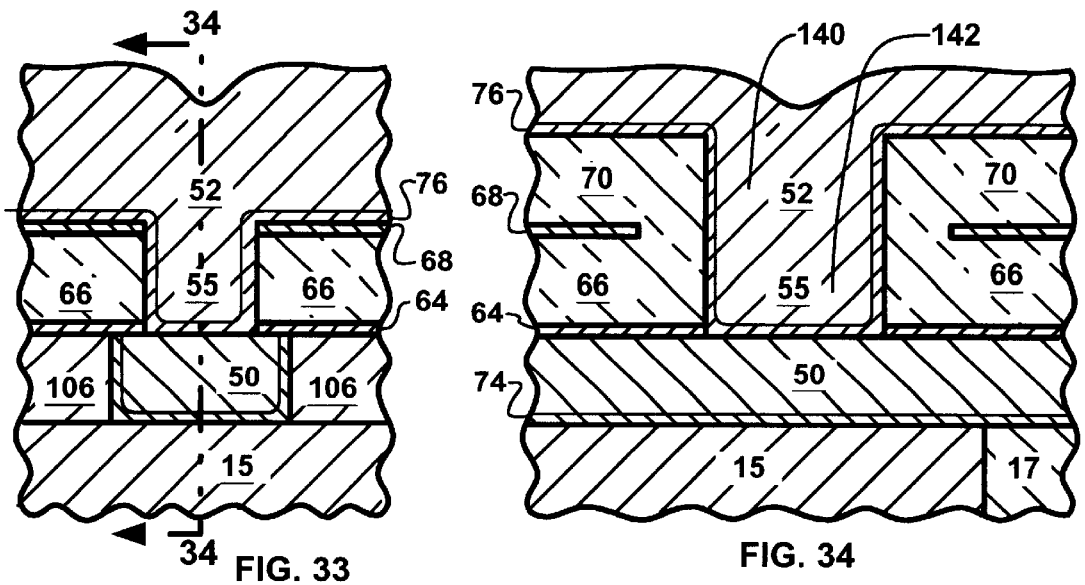
FIG. 33 is FIG. 31 after deposition of a barrier material in the second channel and the self-aligned via.
FIG. 34 is a cross-section of FIG. 33 along line 34—34.

Referring now to FIG. 33, therein is shown the structure of FIG. 31 after the deposition of barrier material 76 and conductive material to form the second channel 52 and the rectangular box, self-aligning via 55.

Referring now to FIG. 34, therein is shown a cross-section of FIG. 33 along line 34—34 showing the width 140 of the second channel 52 and the length 142 of the self-aligning via 55.

Figure 35:
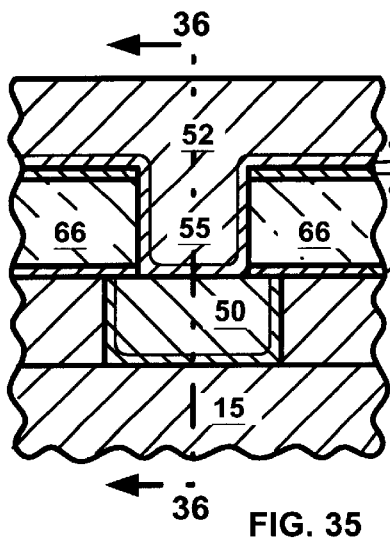
FIG. 35 is FIG. 33 after chemical-mechanical polishing to form the completed aligned channels with self-aligning via.

Referring now to FIG. 35, therein is shown the structure of FIG. 33 after the chemical-mechanical polishing which levels the top of the second channel 52 to the level of the second channel oxide layer 70.

Figure 36:
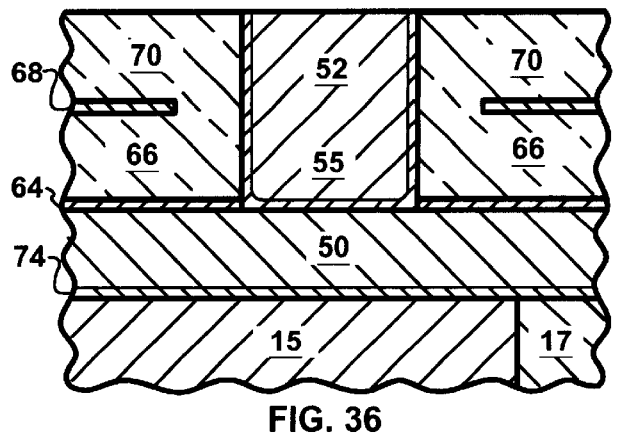
FIG. 36 is a cross-section of FIG. 35 along line 36—36.

Referring now to FIG. 36, therein is shown a cross-section of FIG. 35 along line 36—36 36 again showing the width 140 of the second channel 52 and the length 142 of the self-aligning via 55, shown in FIG. 36.

FIG. 35 and FIG. 36 along with FIG. 5 and FIG. 6 show all the views of properly aligned first and second channels with the self-aligning via of the present invention.

Figure 37:
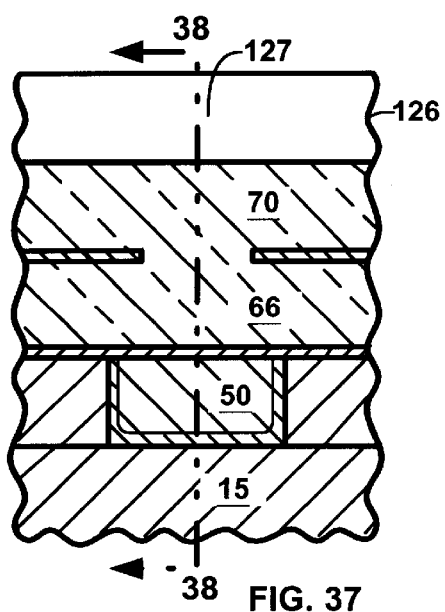
FIG. 37 is a cross-section similar to FIG. 25 with the photolithographic process having misaligned the second channel.

Referring now to FIG. 37, therein is shown the structure of FIG. 23 after a second channel damascene photoresist 126 is in place in the totally wrong or maximum misaligned position. Since the misalignment would be in the direction going into the page in FIG. 35, FIG. 35 is the same as FIG. 25 in which the alignment is exactly where it should be.

Figure 38:
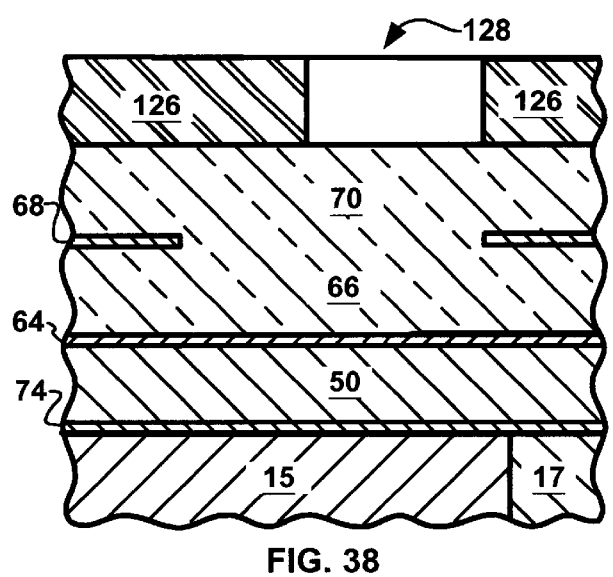
FIG. 38 is a cross-section of FIG. 37 along line 38—38.

Referring now to FIG. 38, therein is shown a cross-section of FIG. 37 along line 38—38 which shows the maximum misalignment of a second channel opening 128 in the damascene photoresist 126. A conventional photolithographic process, which is not optimally, set up forms the damascene photoresist 126 in FIG. 38. In this process, a layer of photoresist is first deposited on the second channel oxide layer 70 but misaligned to the right in FIG. 38, a second channel mask is used to photolithographically expose the photoresist, and the photoresist is developed to create the damascene photoresist 126.

Figure 39:
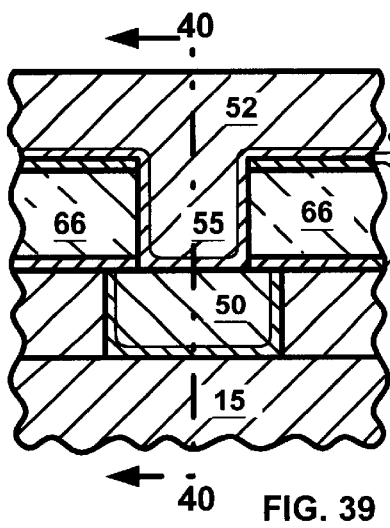
FIG. 39 is FIG. 37 after chemical-mechanical polishing to form the completedmisaligned channels with self-aligning via.

Referring now to FIG. 39, therein is shown the structure of FIG. 37 after the final chemical-mechanical processing step for the misaligned channels with the self-aligning via 55.

Figure 40:
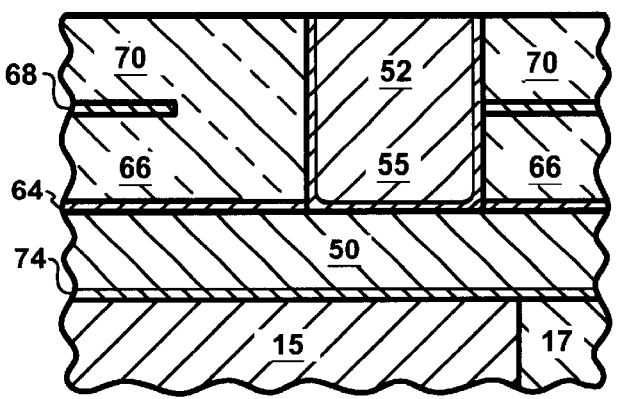
FIG. 40 is a cross-section of FIG. 39 along line 40—40.

Referring now to FIG. 40, therein is shown a cross-section of FIG. 39 along line 40—40. Despite the misalignment of the first and second channels 50 and 52, the size of the rectangular box via 55 is unchanged.

FIG. 39 and FIG. 40 along with FIG. 7 and FIG. 8 show all the views of misaligned first and second channels with the self-aligning via 55 of the present invention.

In production, a conventional first damascene process was used to put down a first channel 10 in a first channel oxide layer (not shown) above portions of a semiconductor device 15 and 17. The damascene process is a photolithographic process which uses a mask to put the first channel 10 in the first channel oxide layer to run in a first direction (which is horizontal in FIG. 1). The stop nitride layer 18, the via oxide layer 20, and the via nitride layer 22 would be successively deposited on top of the first channel 10 and the first channel oxide layer.

By using the via photoresist and the via photolithographic process followed by nitride etching of a round via opening in the via nitride layer 22, the basis for the cylindrical via 23 was formed. The subsequent deposition of the second channel oxide layer 16 prepared the way for the second channel 12 to be perpendicular to the first channel 10. The second damascene process is a photolithographic process which uses a mask to put the second channel 12 in the second channel oxide layer 16. Since in the second damascene process uses an anisotropic oxide etch, the etch also forms the cylindrical via 23 down to the stop nitride layer 18. The anisotropic oxide etch etches faster in the vertical direction of FIG. 2 than in the horizontal direction. The nitride etch of the stop nitride layer 18 completes the etching steps. The deposition of the barrier material and the conductive material forms the second channel 12 and the cylindrical via 23, and this followed by chemical mechanical polishing to complete the conventional connection process.

Due to such problems as aberrations in the lenses used in the photolithographic processes, inaccuracies in the stepping equipment for reproducing images on the semiconductor wafers, photomask alignment problems, etc., the first and second channels 10 and 12 sometimes are misaligned. In these cases, the anisotropic oxide etch will only etch out a truncated cylinder as shown in FIG. 3 PRIOR ART and FIG. 4 PRIOR ART for the truncated semi-cylindrical via 30. The nitride etch of the stop nitride layer 18 also etches out enough of the via nitride layer 22 so the second channel 12 will be complete, but will only open about a half circle in the stop nitride layer 18. With smaller devices, the truncated cylinder may not be large enough for a complete deposition of conductive material.

In production of the present invention, a conventional first damascene process is used to put down the first channel 50 in a first channel oxide layer 106 in electrical contact with the polysilicon gate 15 and of a semiconductor device. The damascene process involves a photolithographic process which uses a mask to put the first channel 50 in the first channel oxide layer 106 to run in a first direction (which is horizontal in FIG. 9) and runs in and out of the page. The stop nitride layer 64, the via oxide layer 66, and the via nitride layer 68 are successively deposited on top of the first channel 50 and the first channel oxide layer 106.

By using the via photoresist 114 and the via photolithographic process followed by nitride etching of a rectangular box via opening in the via nitride layer 68, the basis for the rectangular box via 55 is formed. The length 118 in the via photoresist 114 can be fairly large but is best determined by reference to the alignment tolerance of the second channel mask with regard to the first channel mask. In the best mode, the length 118 is equal to the width 134 (shown in FIG. 30) of the second channel 52 plus twice the 3 sigma alignment tolerance. This will accommodate the maximum misalignment. The elongation of the via 55 is in the direction of the second channel 52 with which it is formed so that a displacement of the channel 52 will not affect the cross-sectional area of the via 55. This will prevent the formation of voids even when the displacement is at one extreme of its tolerance range.

The subsequent deposition of the second channel oxide layer 66 prepares the way for the second channel 52 to be perpendicular to the first channel 50. The second damascene process involves a photolithographic process which uses a mask to put the second channel 52 in the second channel oxide layer 66. Since the second damascene process uses an anisotropic oxide etch, the etch also forms the rectangular box via 55 down to the stop nitride layer 64. The anisotropic oxide etch etches faster in the vertical direction of FIG. 28 than in the horizontal direction. The nitride etch of the stop nitride layer 64 completes the etching steps. The deposition of the barrier material and the conductive material forms the second channel 52 and the rectangular box via 55, and this, followed by chemical-mechanical polishing, completes the connection process of the present invention.

When such problems as aberrations in the lenses used in the photolithographic processes, inaccuracies in the stepping equipment for reproducing images on the semiconductor wafers, photomask alignment problems, etc., the first and second channels 50 and 52 sometimes become misaligned. In these cases, the anisotropic oxide etch will still etch out the volume for the complete rectangular box via 55 and the via 55 will be self-aligned with regard to the first and second channels 50 and 52.

As would be evident to those skilled in the art, as integrated circuits become more complex, more layers of channels than two are required, and the above steps would be repeated to provide vias between multiple layers of channels.

While the best mode utilizes a rectangular box via 55, it should be understood that some of the self-aligning via features may be achieved with elongated oval cross-section cylinder vias or other elongated shapes.

Although various nitride and oxide layers have been described above, those skilled in the art would understand that other well-known low dielectric material layers could be substituted such as HSQ, BCB, Flare, and Silk.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An integrated circuit comprising:
    a semiconductor device;
    a dielectric embedding said semiconductor device;
    a first channel disposed in said dielectric and spaced away from said semiconductor device, said first channel having a horizontal length; and
    a via having a length longer than a width with the length parallel to the horizontal length of said first channel, said via connecting said first channel to said semiconductor device.

2. The integrated circuit as claimed in claim 1 wherein said via has a rectangular cross-section parallel to said first channel with the width narrower than the width of said first channel and the length greater than the width of said first channel.

3. The integrated circuit as claimed in claim 1 wherein said first channel has a vertical thickness and said via has a vertical thickness at least as thick as said first channel.

4. The integrated circuit as claimed in claim 1 wherein said first channel has a rectangular cross section and said via has a rectangular cross-section parallel the rectangular cross section of said first channel.

5. The integrated circuit as claimed in claim 1 wherein said first channel has a rectangular cross section and said via has a non-circular cross-section perpendicular to the rectangular cross section of said first channel.

6. An integrated circuit comprising:
    a semiconductor device;
    a dielectric embedding said semiconductor device;
    a first channel disposed in said dielectric and connected to said semiconductor device;
    a second channel disposed in said dielectric and spaced away from said first channel; and
    a rectangular box via connecting said first channel to said second channel.

7. The integrated circuit as claimed in claim 6 wherein said rectangular box via has a rectangular cross-section parallel to said second channel with a width narrower than the width of said first channel and a length greater than the width of said second channel.

8. The integrated circuit as claimed in claim 6 wherein said first channel has a thickness and said via has a thickness at least as thick as said first channel.

9. The integrated circuit as claimed in claim 6 wherein said first channel has a horizontal rectangular cross section and said via has a horizontal rectangular cross-section parallel to the horizontal rectangular cross section of said first channel.

10. The integrated circuit as claimed in claim 6 wherein said first channel has a vertical rectangular cross section and said via has a vertical rectangular cross-section parallel to the vertical rectangular cross section of said first channel.

* * * * *